(12) United States Patent
Park et al.

(10) Patent No.: US 9,157,938 B2
(45) Date of Patent: Oct. 13, 2015

(54) ON-TIME BASED PEAK CURRENT DENSITY RULE AND DESIGN METHOD

(71) Applicant: Texas Instruments Incorporated, Dallas, TX (US)

(72) Inventors: Young-Joon Park, Plano, TX (US); Siva Prakash Gurrum, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 512 days.

(21) Appl. No.: 13/668,586

(22) Filed: Nov. 5, 2012

(65) Prior Publication Data

US 2014/0129166 A1    May 8, 2014

(51) Int. Cl.
*G06F 19/00*     (2011.01)
*G01R 19/04*     (2006.01)

(52) U.S. Cl.
CPC ...................................... *G01R 19/04* (2013.01)

(58) Field of Classification Search
USPC .......................................................... 702/64
See application file for complete search history.

(56) References Cited

U.S. PATENT DOCUMENTS

2009/0271167 A1    10/2009  Zhu et al.

OTHER PUBLICATIONS

B. K. Liew, Effects of High Current Pulses on Integrated Circuit Metalliza Tion Reliability, Department of Electrical Engineering and Computer Sciences, University of California, Berkeley, California 94720, IEEE 1988, p. 3-6.*

* cited by examiner

*Primary Examiner* — Tung S Lau
(74) *Attorney, Agent, or Firm* — John R. Pessetto; Frank D. Cimino

(57) ABSTRACT

A method of computing a peak current density specification ($j_{peakspec}$) for an electrical conductor line of an integrated circuit (IC) resulting from conducting pulsed electrical current represented as a current waveform. An on-time ($t_{on}$) is identified for the current waveform based on a current density being greater than or equal to ($\geq$) a predetermined current density level. The $j_{peakspec}$ is computed for the electrical conductor line using a $j_{peakspec}$ modeling equation which includes the $t_{on}$ for the current waveform and a thermal time constant ($\tau$) for the electrical conductor line.

3 Claims, 3 Drawing Sheets

MODELED THERMAL PARAMETERS $$j_{peakspec} = j_{rmsref} \left[ \frac{dT_{spec}}{dT_{ref}} \frac{1}{\left[1-\exp\left(-\frac{t_{on}}{\tau}\right)\right]} \right]^{\frac{1}{2}}$$

IN NORMALIZED MAGNITUDE

| | $\tau$ (time unit) | $j_{rmsref}$ (A/cm$^2$) | $dT_{ref}$(C) |
|---|---|---|---|
| M1 | 0.8 | 53.5 | 25 |
| M2 | 2.5 | 36.2 | 25 |
| M3 | 4.0 | 29.6 | 25 |
| M4 | 7.0 | 25.7 | 25 |
| M5 | 12.0 | 21.0 | 25 |

ON-TIME BASED PEAK CURRENT DENSITY RULE AND DESIGN METHOD

FIELD

Disclosed embodiments relate to reliability of integrated circuits, and more particularly to the peak current density parameter for electrical conductor (e.g., interconnect) lines on integrated circuits and design of integrated circuits.

BACKGROUND

Integrated circuits (ICs) are often designed to meet aggressive device density and circuit performance specifications. This trend has resulted in a reduction of the interconnect metal pitch and has increased the number of metallization levels. Aggressive interconnect scaling has increased current densities and associated thermal effects.

Thermal effects are an inherent aspect of electrical power distribution and signal transmission through the interconnects due to self-heating (or Joule heating) caused by resistance to the flow of electrical current. For a given process, circuit designers for IC designs using the process are provided maximum allowable values for three different interconnect current densities. These interconnect current densities are the average current density (javg), the root mean square (RMS) current density (jrms), and the peak current density (jpeak). The peak current density ($j_{peak}$) is simply the current density corresponding to the peak current level of the waveform, where the waveform refers to the visual shape (amplitude vs. time) resulting from pulsed electrical current through a conductor:

$$j_{peak} = \frac{I_{peak}}{A} \quad (1)$$

where A is the cross-sectional area of the interconnect or other electrical conductor line. Equation 1 does not consider the width of the pulse or the adjacent layers (e.g., dielectric layers) to the electrical conductor line which determines the thermal resistance reflected in a thermal time constant ($\tau$) associated with the conductor line. Designing ICs to have a $j_{peak}$ at or below an allowed $j_{peak}$ limit (or $j_{peak}$ specification) avoids unwanted melting failure in the IC. For example, if a given design results in a metal interconnect line having a $j_{peak} \geq a\ J_{peak}$ specification limit, the metal line widths may be increased to reduce the $j_{peak}$.

The average current density is defined as:

$$j_{avg} = \frac{1}{T} \int_0^T j(t)\,dt \quad (2)$$

where T is the time period of the current waveform. The RMS current density is defined over T as:

$$j_{rms} = \sqrt{\frac{1}{T} \int_0^T j^2(t)\,dt} \quad (3)$$

SUMMARY

Disclosed embodiments recognize the temperature reached due to Joule heating in electrical conductor lines is not only a function of peak current ($I_{peak}$) and area of the line, but also the width of the current waveform (on-time), particularly for waveform (e.g., pulse) widths on the order of 100s of nsecs. The Joule heat-up (and cool down) effect for conductor lines (e.g., of an interconnect layer) takes time for the maximum temperature (and minimum temperature when cooling) to be reached as compared to the faster electrical current rise time. Thus, disclosed embodiments recognize for a given $I_{peak}$, the maximum temperature reached due to Joule heating is also a function of the current waveform width (on-time). Therefore, a conventional constant jpeak specification will generally be too conservative for short waveform widths unnecessarily limiting current density and thus the circuit speed or circuit density, while being too aggressive for long waveforms thus risking not guaranteeing sufficient reliability, including risking unwanted melting failures in the integrated circuit (IC).

BRIEF DESCRIPTION OF THE DRAWINGS

Reference will now be made to the accompanying drawings, which are not necessarily drawn to scale, wherein.

DETAILED DESCRIPTION

Figure 1A:
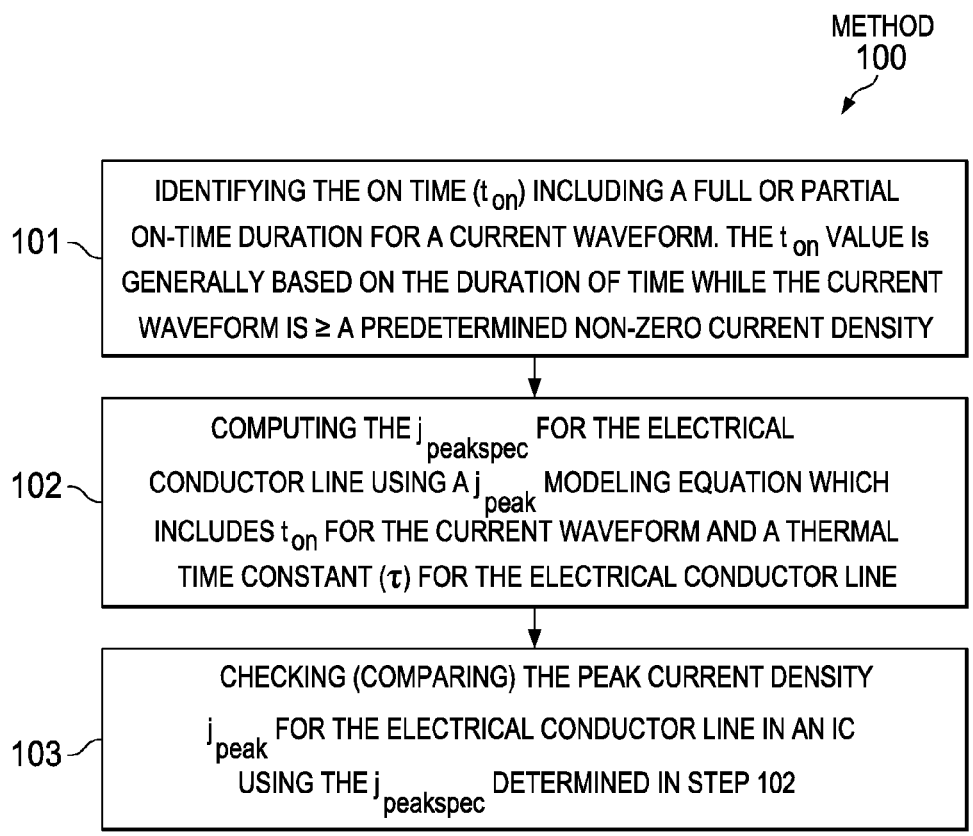
FIG. 1A is a flow chart that shows steps in an example method of computing a peak current density specification ($j_{peakspec}$) for a conductor line responsive to a current pulse using a modeling equation that includes the on-time ($t_{on}$) of the current waveform and a thermal time constant ($\tau$) for the conductor line, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a flow chart that shows steps in an example method 100 of computing a $j_{peakspec}$ for an electrical conductor line in an IC responsive to a current waveform, where the modeling equation utilizes the $t_{on}$ of the current waveform, according to an example embodiment. The electrical conductor line can comprise a metal interconnect line (e.g., copper line), a doped polysilicon line, or a thin film resistor (e.g., SiCr). Step 101 comprises identifying $t_{on}$ including a full or partial on-time duration for the current waveform.

The $t_{on}$ value is generally based on the duration of time while the current waveform is ≥a predetermined non-zero current density. When the waveform includes multiple sub-waveforms all spaced within a predetermined time range, such as from 0.001$\tau$ to 10$\tau$, $t_{on}$ can be calculated between the beginning and ending sub-waveforms at the predetermined current density (See FIG. 1C described below).

Step 102 comprises computing the $j_{peakspec}$ for the electrical conductor line using a $j_{peak}$ modeling equation which includes the $t_{on}$ for the current waveform and $\tau$ for the electrical conductor line. For example, Equation 7 described below may be used.

Step 103 comprises checking (comparing) the peak current density $j_{peak}$ for the electrical conductor line in an IC (e.g., obtained by a Simulation Program with Integrated Circuit Emphasis (SPICE) simulation) using the $j_{peakspec}$ determined in step 102. Redesign of the electrical conductor line may follow based on the checking. For example, the electrical conductor line may be widened if the jpeak of the current waveform is above a predetermined level (e.g., $0.9\ j_{peakspec}$), and optionally narrowed if the jpeak of the waveform is below a predetermined level (e.g., $0.7\ j_{peakspec}$).

The modeling equation may utilize Equation 7 shown below, which can be derived starting with Equations 4 and 5 as described below. Equation 4 represents the transient temperature (T) response of the electrical conductor line due to Joule heating as a function of $t_{on}$ and $\tau$ for a rectangular pulse, where $\tau$ is the thermal time constant which relates to the heat up or cool down rate of the electrical conductor line based on its thermal resistance to its heat sink(s). Equation 5 represents the steady state T reached by the electrical conductor line due to Joule heating for a given jpeak, $dT_{ref}$ in (5) is a reference temperature increase, and $j_{rmsref}$ is a reference root mean square (rms) current density which generates the $dT_{ref}$:

$$dT = dT_{DC}\left[1 - \exp\left(-\frac{t_{on}}{\tau}\right)\right] \quad (4)$$

$$dT_{DC.for.a.peak} = \left(\frac{j_{peak}}{j_{rms.ref}}\right)^2 dT_{ref} \quad (5)$$

Insert 5 to 4 and replace dT by $dT_{spec}$ which is the Joule heating (JH) limit (specification) for a peak yields equation (6) below:

$$dT_{spec} = \left(\frac{j_{peakspec}}{j_{rmsref}}\right)^2 dT_{ref}\left[1 - \exp\left(-\frac{t_{on}}{\tau}\right)\right] \quad (6)$$

$j_{rmsref}/dT_{ref}$ are constants, where $dT_{ref}$ may be 25° C., and $j_{rmsref}$ is a constant based on a given structure (e.g., metal interconnect stack including interlevel dielectrics). Solving (6) for $j_{peakspec}$ yields Equation (7) shown below.

$$j_{peakspec} = j_{rmsref}\left[\frac{dT_{spec}}{dT_{ref}} \frac{1}{\left[1 - \exp\left(-\frac{t_{on}}{\tau}\right)\right]}\right]^{\frac{1}{2}} \quad (7)$$

Although Equation 7 provides a particular $j_{peakspec}$ equation, other equations may be used in place of Equations 4 and 5 to derive alternatives to Equations 6, 7. Alternatives to Equations 6, 7 all include terms to account for $t_{on}$—for the current waveform and $\tau$ for the electrical conductor line.

Figure 1B:
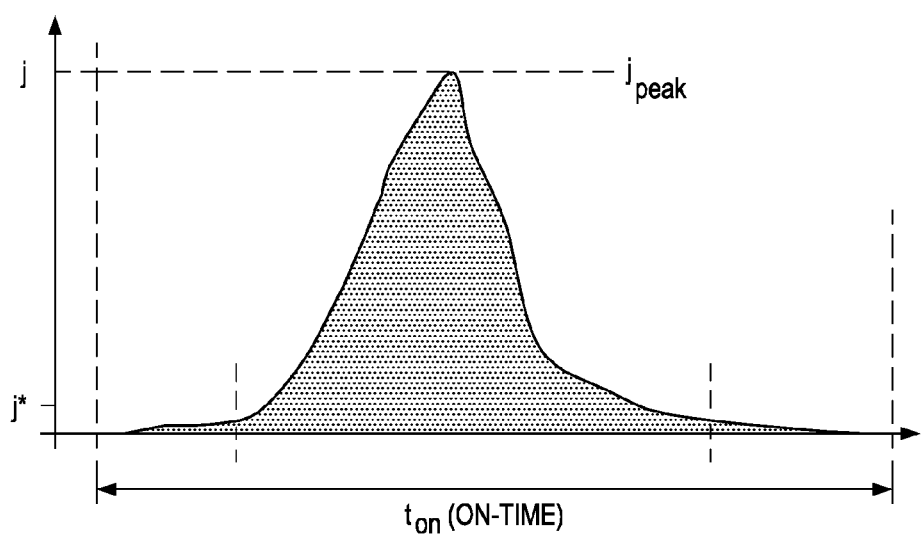
FIGS. 1B and 1C show how $t_{on}$ is calculated for a single current waveform pulse and for a plurality of closely spaced sub-waveform pulses which may be treated as a single current waveform, respectively, according to example embodiments.
Figure 1C:
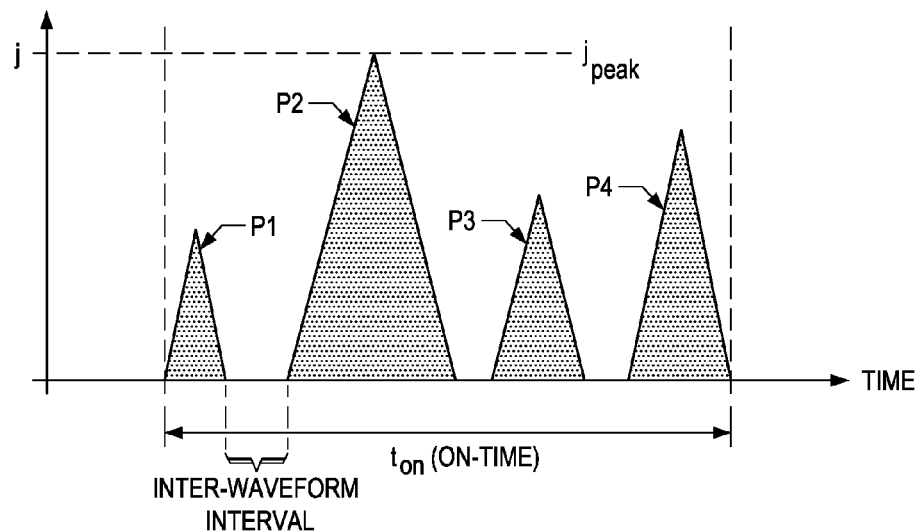

FIGS. 1B and 1C show how $t_{on}$ may be calculated for a single waveform pulse and for a plurality of closely spaced sub-waveform pulses which may be treated as a single waveform, respectively. FIG. 1B shows $t_{on}$ can include the whole pulse width where j is greater than or equal to ($\geq$) a predetermined current density level shown as j*.

The $j_{peak}$ value shown corresponds to the peak j. However, in another embodiment, the $j_{peak}$ value used is averaged over specific interval within the T, such as defined between where j is greater than or equal to ($\geq$) a predetermined current density level shown as j; where j>>j*, such as j*=0.1 to 10% of $j_{peak}$, and j**=75 to 99% of $j_{peak}$.

In FIG. 1C, the current waveform shown includes multiple sub-waveforms having inter-waveform intervals having no current therebetween, where the edge-to-edge spacing of the neighboring sub-waveforms is less than or equal to ($\leq$) $5\tau$, such as 2, 3, 4 or $5\tau$. Thus, in this embodiment, the four (4) neighboring waveforms shown as $P_1$, $P_2$, $P_3$ and $P_4$ may be considered sub-waveforms of a single current waveform, so that the $t_{on}$ value can be considered to extend from the beginning of the first sub-waveform (e.g., from j*=0.1 to 10% of $j_{peak}$, such as 2% $j_{peak}$ in one particular embodiment) to the end of the rightmost sub-waveform (e.g., at j*=0.1 to 10% of $j_{peak}$ such as 2% $j_{peak}$ in one particular embodiment).

Figure 2:
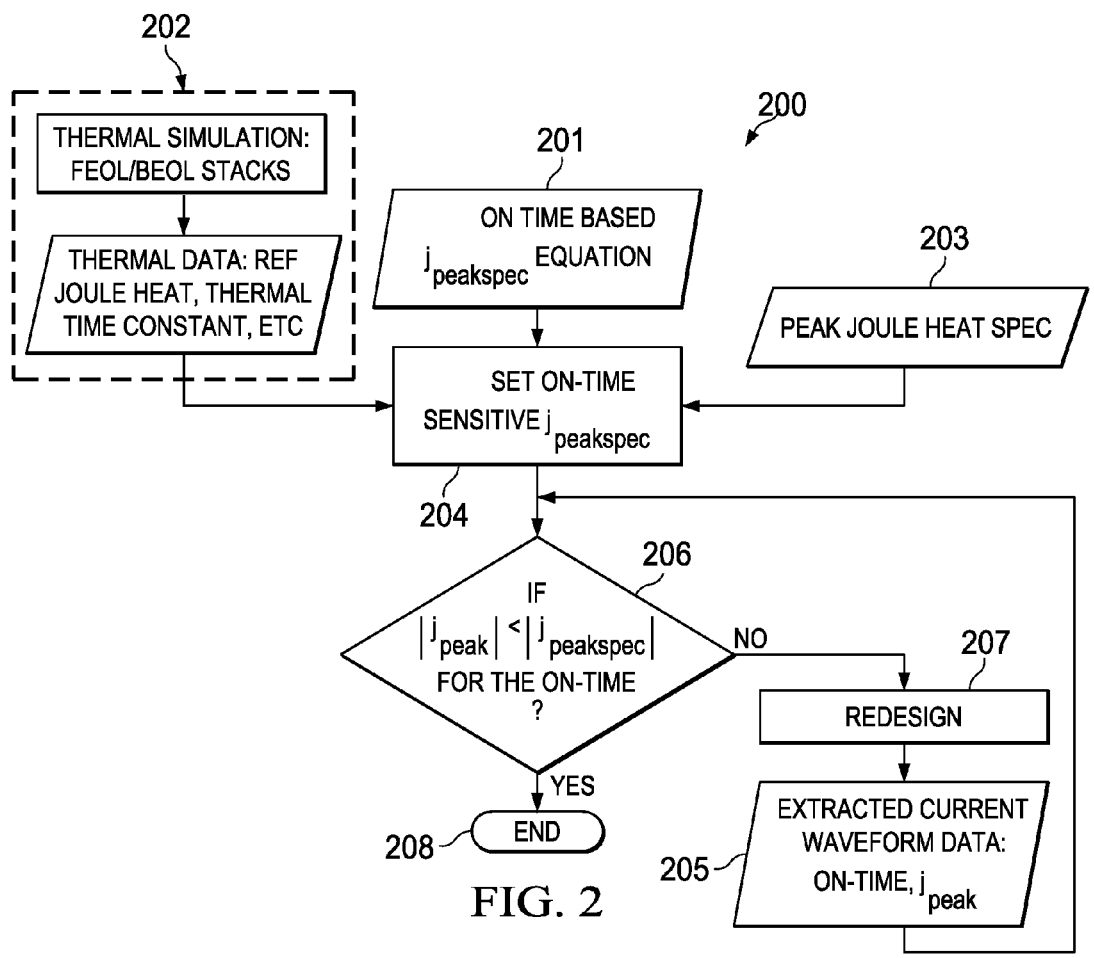
FIG. 2 is a flow diagram for an example method of checking the jpeak for conductor lines in ICs using a disclosed $J_{peakspec}$ utilizing an equation that includes $t_{on}$ and $\tau$, according to an example embodiment.

In another embodiment, the j*value is obtained by reference to the $J_{peakspec}$ value, such as a j* at the beginning of the first sub-waveform at 0.1 to 10% of $j_{peakspec}$ for long $t_{on}$, to a j* at the end of the rightmost sub-waveform at 0.1 to 10% of $j_{peakspec}$ for long $t_{on}$. In one particular example, a j* value between 0.1 to 10% of jpeakspec is used for $t_{on}=100\tau$. If $t_{on}=100\tau$ is used in Equation 7, the exponential term will be $e^{-100}$ (equal to essentially zero), so that the jpeakspec for a long $t_{on}$ such as $100\tau$ is obtained where the Joule heat is sufficiently saturated (thermal equilibrium). Using the jpeakspec to set j* has an advantage of having the same thermal meaning for all the electrical conductor layers, regardless of their $\tau$ value or designed $j_{peak}$ value, but rather on the equilibrium thermal condition of the electrical conductor line or layer FIG. 2 is a flow diagram 200 for an example method of checking the $j_{peak}$ of conductor lines in ICs using a disclosed $J_{peakspec}$ derived from an equation that accounts for $t_{on}$ and $\tau$, such as equation 7 described above, according to an example embodiment. Flow diagram 200 is related to, but is more detailed, as compared to method 100 shown in FIG. 1A. Step 201 comprises providing an on-time based $j_{peakspec}$ equation, for example, equation 7 shown above. Step 202 comprises using thermal simulation software to simulate front end of the line (FEOL)/back end of the line (BEOL) stacks to generate simulated data including thermal data, reference Joule heat, and $\tau$. Step 203 comprises providing a peak Joule heat spec value. Step 204 comprises setting a $t_{on}$ sensitive $j_{peakspec}$ expression value using the peak joule heat spec value and the simulated thermal data provided.

Step 205 comprises extracting current waveform data including $t_{on}$ and jpeak for the current waveform. Current waveform data is based on an operating point which defines the current waveform that is generally customer/user specific. Step 206 comprises comparing the $j_{peak}$ provided in step 205 to the $j_{peakspec}$ value obtained from evaluating the $t_{on}$ sensitive $j_{peakspec}$ expression described in step 204 (moving along the curve shown in FIG. 3B based on $t_{on}$) using the $t_{on}$ value from step 205. If |j_peak|>|j_peak_spec|, step 207 is reached comprising redesign of the electrical conductor line, such as widening of the conductor line. If $|j_{peak}| \geq |j_{peakspec}|$ step 208 is reached and the method is ended, or another conductor line on the IC is then checked.

Disclosed embodiments include machine readable storage for implementing disclosed algorithms, including generating a $t_{on}$ sensitive $j_{peakspec}$ for an electrical conductor line of an IC resulting from conducting pulsed electrical current, including a non-transitory machine readable storage medium having $j_{peakspec}$ generating code coded as a set of instructions stored therein. The non-transitory machine readable storage medium can include, for example, static random access memory (SRAM), read-only memory (ROM), and/or a program storage device.

EXAMPLES

Disclosed embodiments are further illustrated by the following specific Examples, which should not be construed as limiting the scope or content of this Disclosure in any way.

Figures 3A, 3B:
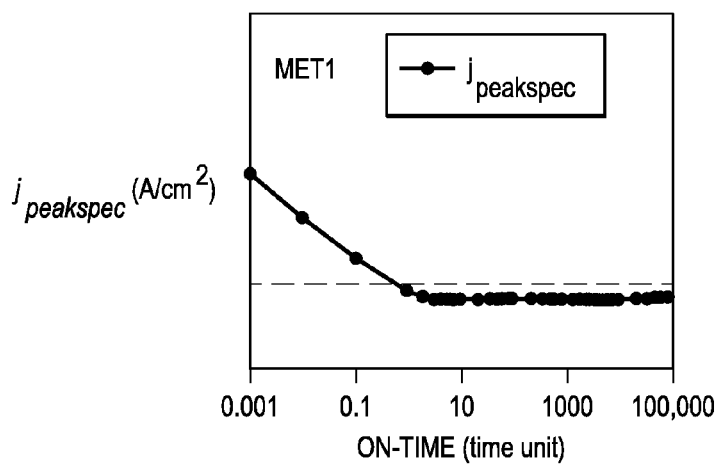
FIGS. 3A and 3B show modeled parameters and the generation of a new $J_{peakspec}$ for a metal interconnect line, respectively, according to example embodiments.

FIGS. 3A and 3B show modeled (simulated) thermal parameters (corresponding to the output from step 202) and the generation of a new $J_{peakspec}$ for a metal layer, respectively. Modeled $\tau$, $j_{rmsref}$ and $dT_{ref}$ are shown for M1-M5. The $j_{rmsref}$ depends on the layer position. The $dT_{spec}$ was set to 50° C. In FIG. 3B, a $t_{on}$ based jpeakspec is shown provided, with more relaxed rules for $j_{peakspec}$ for short pulses (e.g., $t_{on}$<0.1 time unit) and a tighter $j_{peakspec}$ shown to improve reliability for long pulses (e.g., $t_{on}$>6 time units) compared to a conventional $j_{peakspec}$ that is independent of $t_{on}$.

Disclosed embodiments can be used to aid IC design with processes which form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. Machine readable storage for generating an on-time ($t_{on}$) sensitive peak current density specification ($j_{peakspec}$) for an electrical conductor line of an integrated circuit (IC) resulting from conducting pulsed electrical current represented as a current waveform, comprising:

a non-transitory machine readable storage medium having $j_{peakspec}$ generating code stored therein, said $j_{peakspec}$ generating code including;

code for identifying said on-time ($t_{on}$) for said current waveform based on a current density being greater than or equal to ($\geq$) a predetermined current density level, and code for computing said $j_{peakspec}$ for said electrical conductor line using a $j_{peakspec}$ modeling equation which includes said $t_{on}$ for said current waveform and a thermal time constant ($\tau$) for said electrical conductor line; wherein said $J_{peakspec}$ modeling equation comprises:

$$j_{peakspec} = j_{rmsref}\left[\frac{dT_{spec}}{dT_{ref}}\frac{1}{\left[1-\exp\left(-\frac{t_{on}}{\tau}\right)\right]}\right]^{\frac{1}{2}}$$

wherein:
$dT_{spec}$ is an allowed peak temperature increase;
$dT_{ref}$ is a reference temperature increase,
$j_{rmsref}$ is a reference root mean square (rms) current density which generates said $dT_{ref}$ and
$\tau$ is said thermal time constant.

2. The machine readable storage of claim 1, wherein said current waveform includes multiple sub-waveforms having inter-waveform intervals having no current therebetween calculated between a beginning and ending sub-waveform at said predetermined current density level.

3. The machine readable storage of claim 2, wherein an edge-to-edge spacing of neighboring ones of said multiple sub-waveforms is less than or equal to ($\leq$) 5$\tau$.

* * * * *